(12) United States Patent
Elran et al.

(10) Patent No.: US 9,397,648 B1
(45) Date of Patent: Jul. 19, 2016

(54) SYSTEMS, CIRCUITRY, AND METHODS FOR DECODING PULSE WIDTH MODULATED SIGNAL

(71) Applicant: SanDisk Technologies Inc., Plano, TX (US)

(72) Inventors: Tomer Elran, Petah Tikva (IL); Alexander Tetelbaum, Beer Sheva (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/639,720

(22) Filed: Mar. 5, 2015

(51) Int. Cl.
*H03K 3/26* (2006.01)
*H03K 9/08* (2006.01)
*H03K 7/08* (2006.01)
*H03F 3/217* (2006.01)
*H02M 3/335* (2006.01)

(52) U.S. Cl.
CPC .............. *H03K 9/08* (2013.01); *H02M 3/33507* (2013.01); *H03F 3/217* (2013.01); *H03K 7/08* (2013.01)

(58) Field of Classification Search
CPC ......... H03K 7/08; H03K 9/08; H03K 3/0231; H03F 3/217; H03M 3/33507
USPC ........ 331/111, 143; 330/10; 363/95, 78, 21.1, 363/21.11; 332/109; 323/282
See application file for complete search history.

(56) References Cited

U.S. PATENT DOCUMENTS

| | | | | |
|---|---|---|---|---|
| 2005/0270093 | A1* | 12/2005 | Kurokawa | H03F 3/2173 330/10 |
| 2013/0063166 | A1* | 3/2013 | Ng | G01R 31/343 324/682 |

* cited by examiner

*Primary Examiner* — Arnold Kinkead
(74) *Attorney, Agent, or Firm* — Martine Penilla Group, LLP

(57) ABSTRACT

A first charge module includes a first resistor and a first capacitor. A second charge module includes a second resistor and a second capacitor. A voltage comparison module includes a comparator connected to compare voltages present on the first and second capacitors. The comparator is connected to output a signal having a first state when the voltage on the first capacitor is less than the voltage on the second capacitor, and output a signal having a second state opposite of the first state when the voltage on the first capacitor is greater than the voltage on the second capacitor. A control module is configured to receive a PWM signal as an input signal and generate control signals based on the received PWM signal for controlling charging and discharging of the first and second capacitors. The output of the comparator is a decoded version of the PWM signal.

20 Claims, 9 Drawing Sheets

US 9,397,648 B1

SYSTEMS, CIRCUITRY, AND METHODS FOR DECODING PULSE WIDTH MODULATED SIGNAL

BACKGROUND

1. Field of the Invention

The present invention relates to decoding/demodulating pulse width modulated signals.

2. Description of the Related Art

A pulse width modulated (PWM) signal is a digital signal that is modulated by duty cycle to encode information. The duty cycle of the PWM signal is defined as a percentage of a given cycle time of the PWM signal at which the PWM signal is in a high state. For example, if a given cycle of the PWM signal has a duty cycle of 40%, the PWM signal is in the high state for 40% of the given cycle, and in the low state for the other 60% of the given cycle. The PWM signal can include variations in duty cycle between different cycles of the PWM signal, with the variations in duty cycle corresponding to an encoding of information. For example, a first duty cycle in the PWM signal can represent a first digital logic state, and a second duty cycle in the PWM signal can represent a second digital logic state. For example, the first duty cycle of the PWM signal can be a 40% duty cycle that represents a digital logic state of zero, and the second duty cycle of the PWM signal can be a 60% duty cycle that represents a digital logic state of one. Therefore, if the PWM signal includes two successive cycles that have the 40% duty cycle followed by the 60% duty cycle, these two successive cycles of the PWM signal will decode to the digital logic state of zero followed by the digital logic state of one. Also, the PWM signal can vary in frequency, which corresponds to a change in the period, i.e., duration, of different cycles of the PWM signal. Decoding of the PWM signal is necessary to obtain the information represented by the modulation of the duty cycle with the PWM signal. It is within this context that the present invention arises.

SUMMARY

In one example embodiment, a system is disclosed for decoding a PWM signal. The system includes a first charge module that includes a first RC circuit that includes a first resistor and a first capacitor. The system includes a second charge module that includes a second RC circuit that includes a second resistor and a second capacitor. The second resistor is substantially equal to the first resistor. The second capacitor is substantially equal to the first capacitor. The system includes a voltage comparison module that includes a comparator connected to compare voltages present on the first and second capacitors. The comparator is also connected to output a signal having a first state when the voltage on the first capacitor is less than the voltage on the second capacitor, and output a signal having a second state opposite of the first state when the voltage on the first capacitor is greater than the voltage on the second capacitor. The system also includes a control module configured to receive a PWM signal as an input signal. The control module is configured to generate control signals based on the received PWM signal. The control signals include a first charge control signal directing charging of the first capacitor in accordance with a low state of the PWM signal. The control signals also include a second charge control signal directing charging of the second capacitor in accordance with a high state of the PWM signal. The control signals also include a discharge control signal directing discharge of both the first capacitor and the second capacitor at each cycle-to-cycle transition of the PWM signal. The cycle-to-cycle transition of the PWM signal corresponds to a transition of the PWM signal from a high state to a low state.

In one example embodiment, a circuit is disclosed for decoding a PWM signal. The circuit includes a first PMOS transistor having a gate, a source, and a drain. The gate of the first PMOS transistor is connected to receive a first charge control signal as a delayed and non-inverted version of the PWM signal. The source of first PMOS transistor is connected to a power supply. The circuit also includes a first resistor connected between the drain of the first PMOS transistor and a first charge node. The circuit also includes a first capacitor connected between the first charge node and a reference ground potential. The circuit also includes a first NMOS transistor having a gate, a source, and a drain. The drain of the first NMOS transistor is connected to the first charge node. The source of the first NMOS transistor is connected to the reference ground potential. The gate of the first NMOS transistor is connected to receive a discharge control signal. The circuit also includes a second PMOS transistor having a gate, a source, and a drain. The gate of the second PMOS transistor is connected to receive a second charge control signal as a delayed and inverted version of the PWM signal. The source of second PMOS transistor is connected to the power supply. The circuit also includes a second resistor connected between the drain of the second PMOS transistor and a second charge node. The circuit also includes a second capacitor connected between the second charge node and the reference ground potential. The circuit also includes a second NMOS transistor having a gate, a source, and a drain. The drain of the second NMOS transistor is connected to the second charge node. The source of the second NMOS transistor is connected to the reference ground potential. The gate of the second NMOS transistor is connected to receive the discharge control signal. The circuit also includes a comparator connected to compare voltages present on the first and second charge nodes. The comparator is configured to generate a signal having a first state when the voltage on the first charge node is less than the voltage on the second charge node. The comparator is configured to generate a signal having a second state opposite of the first state when the voltage on the first charge node is greater than the voltage on the second charge node. The signals output by the comparator are a decoding of the PWM signal.

In one example embodiment, a method is disclosed for decoding a PWM signal. The method includes receiving the PWM signal having a cyclic form, where each cycle-to-cycle transition of the PWM signal corresponds to a transition of the PWM signal from a high state to a low state. The method includes charging a first capacitor in an RC manner when the PWM signal is in the low state, during each cycle of the PWM signal, and charging a second capacitor in the RC manner when the PWM signal is in the high state, during each cycle of the PWM signal. The method also includes comparing voltages present on the first and second capacitors at an end of each cycle of the PWM signal to generate an output signal having a first state when the voltage on the first capacitor is less than the voltage on the second capacitor, and having a second state opposite of the first state when the voltage on the first capacitor is greater than the voltage on the second capacitor. The output signal represents the decoding of the PWM signal.

Other aspects of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Systems are disclosed herein for decoding (demodulating) a PWM signal that may have an unstable frequency in which the frequency of the PWM signal can change between different cycles of the PWM signal. In some embodiments, the PWM signal for decoding by the systems disclosed herein can change in frequency over a range from 100 MHz (megaHertz) to 400 MHz, or more, or less. However, it should be understood that the systems disclosed herein for decoding PWM signals can be used to decode essentially any PWM signal, regardless of its frequency or change in its frequency.

Figure 1:
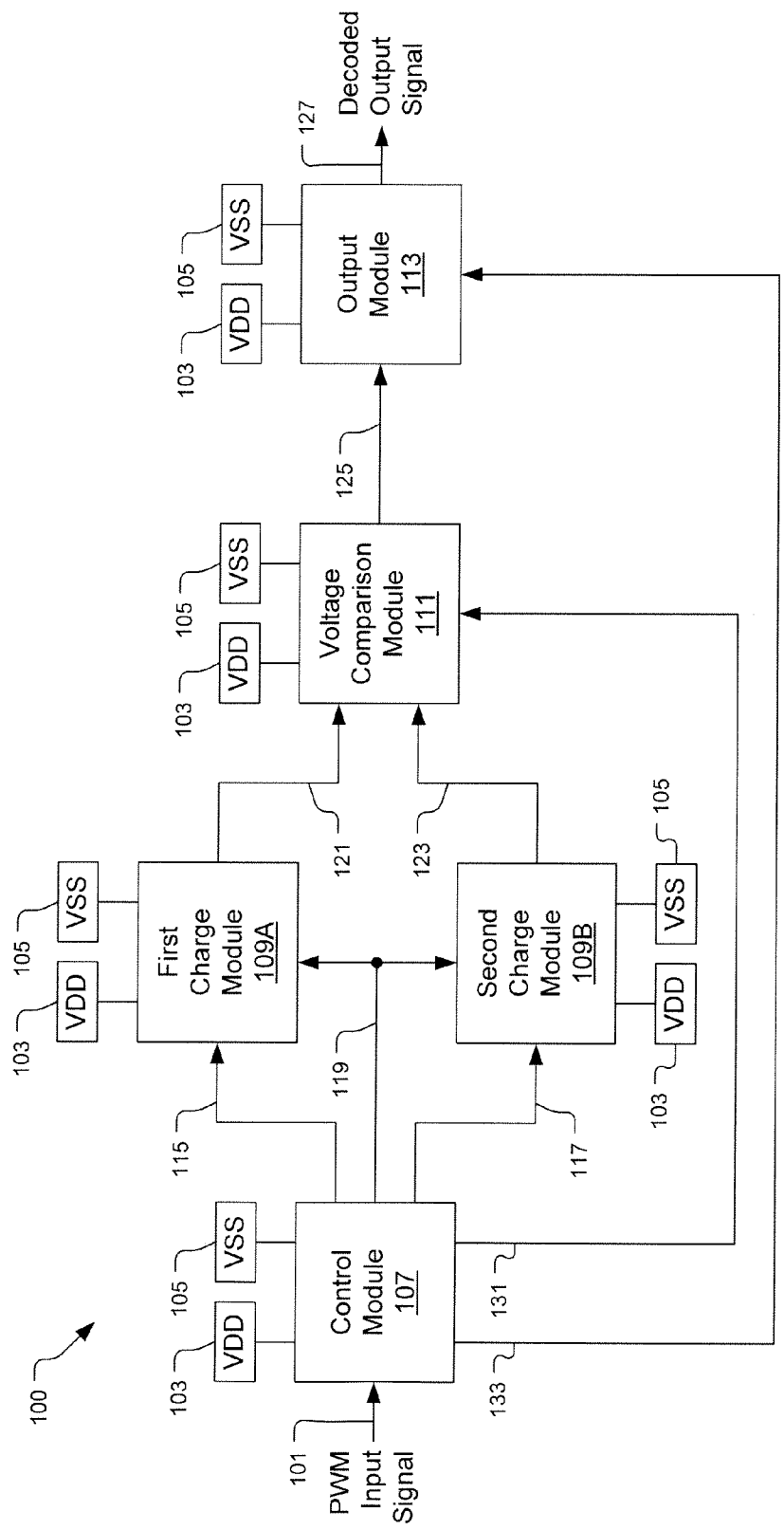
FIG. 1 shows a system for decoding a PWM signal, in accordance with some embodiments of the present invention.

FIG. 1 shows a system 100 for decoding a PWM signal, in accordance with some embodiments of the present invention. The system 100 includes a first charge module 109A that includes a first RC circuit. The first RC circuit includes a first resistor and a first capacitor. The system 100 also includes a second charge module 109B that includes a second RC circuit. The second RC circuit includes a second resistor and a second capacitor. The second resistor of the second charge module 109B is substantially equal to the first resistor of the first charge module 109A. Also, the second capacitor of the second charge module 109B is substantially equal to the first capacitor of the first charge module 109A. In this configuration, the first and second capacitors will accumulate charge in a substantially equal manner when connected to a same charging power supply.

In various embodiments, the first resistor can be defined as either a single resistor or as an array of resistors, with the array of resistors including a number of resistors connected in series and/or in parallel. And, because the first and second resistors are defined in an equivalent manner, the second resistor can also be defined as either a single resistor or as an array of resistors, with the array of resistors including a number of resistors connected in series and/or in parallel. Also, in various embodiments, the first capacitor can be defined as either a single capacitor or as an array of capacitors. And, because the first and second capacitors are defined in an equivalent manner, the second capacitor can also be defined as either a single capacitor or as an array of capacitors. Additionally, in some embodiments, each of the first and second resistors can be defined in a programmable manner, such that their electrical resistance can be changed during operation of the system 100 by adding or removing resistance. For example, switches can be utilized to provide for adding or removing resistance to/from each of the first and second resistors. Similarly, in some embodiments, each of the first and second capacitors can be defined in a programmable manner, such that their electrical capacitance can be changed during operation of the system 100 by adding or removing capacitance. For example, switches can be utilized to provide for adding or removing capacitance to/from each of the first and second capacitors. Adjustment of the resistances of the first and second resistors and/or capacitances of the first and second capacitors allows for handling of frequency variations within the PWM signal.

The system 100 also includes a voltage comparison module 111 that includes a comparator connected to compare voltages present on the first capacitor of the first charge module 109A and second capacitor of the second charge module 109B. The voltage comparison module 111 receives, as an input, a first node voltage 121 corresponding to a voltage present on the first capacitor of the first charge module 109A. The voltage comparison module 111 also receives, as another input, a second node voltage 123 corresponding to a voltage present on the second capacitor of the second charge module 109B. The voltage comparison module 111 is configured to generate an output signal 125 having a first state when the voltage on the first capacitor of the first charge module 109A is less than the voltage on the second capacitor of the second charge module 109B. The voltage comparison module 111 is also configured to generate the output signal 125 having a second state opposite of the first state when the voltage on the first capacitor of the first charge module 109A is greater than the voltage on the second capacitor of the second charge module 109B.

The system 100 also includes a control module 107 configured to receive a PWM input signal 101. The control module 107 is configured to generate control signals based on the received PWM input signal 101. The control signals include a first charge control signal 115 generated to direct charging of the first capacitor of the first charge module 109A in accordance with a low state of the PWM input signal 101. The control signals also include a second charge control signal 117 generated to direct charging of the second capacitor of the second charge module 109B in accordance with a high state of the PWM input signal 101. The control signals also include a discharge control signal 119 generated to direct discharging of both the first capacitor of the first charge module 109A and the second capacitor of the second charge module 109B at each cycle-to-cycle transition of the PWM input signal 101. The cycle-to-cycle transition of the PWM input signal 101 corresponds to a transition of the PWM input signal 101 from a high state to a low state. The control signals also include a comparison reset control signal 131 generated to direct resetting of the comparator at each cycle-to-cycle transition of the PWM signal.

The system 100 can also include an output module 113 configured to receive the output signal 125 from the voltage comparison module 111 and process the received output signal 125 to generate a decoded output signal 127. In some embodiments, the output module 113 can include a clocking module for generating an internal clock signal. The output module 113 can use the internal clock signal to output the decoded output signal 127 in a synchronous manner. The output module 113 can also include a latching module for capturing and holding the output signal 125 of the voltage comparison module 111 for output in accordance with the internal clock signal. In some embodiments, the control module 107 is configured to generate and transmit output control signals 133 to the output module 113 for use in coordinating the generation and transmission of the decoded output signal 127 based on the cyclic characteristics of the PWM input signal 101. Is some embodiments, the first charge control signal 115 and the second charge control signal 117 are provided as the output control signals 133 to the output module 113.

The decoded output signal 127 generated by the output module 113 represents a decoding of the PWM input signal 101. In some embodiments, the decoded output signal 127 generated by the output module 113 is non-inverted relative to the output signal 125 generated by the voltage comparison module 111. However, in some embodiments, the decoded output signal 127 generated by the output module 113 is inverted relative to the output signal 125 generated by the voltage comparison module 111. In either case, the decoded output signal 127 represents a decoding of the PWM input signal 101 based on variation in duty cycle within the PWM input signal 101. Each of the control module 107, the first charge module 109A, the second charge module 109B, the voltage comparison module 111, and the output module 113 are configured and connected to operate in accordance with a common power supply VDD 103 and a common reference ground potential VSS 105.

Figure 2:
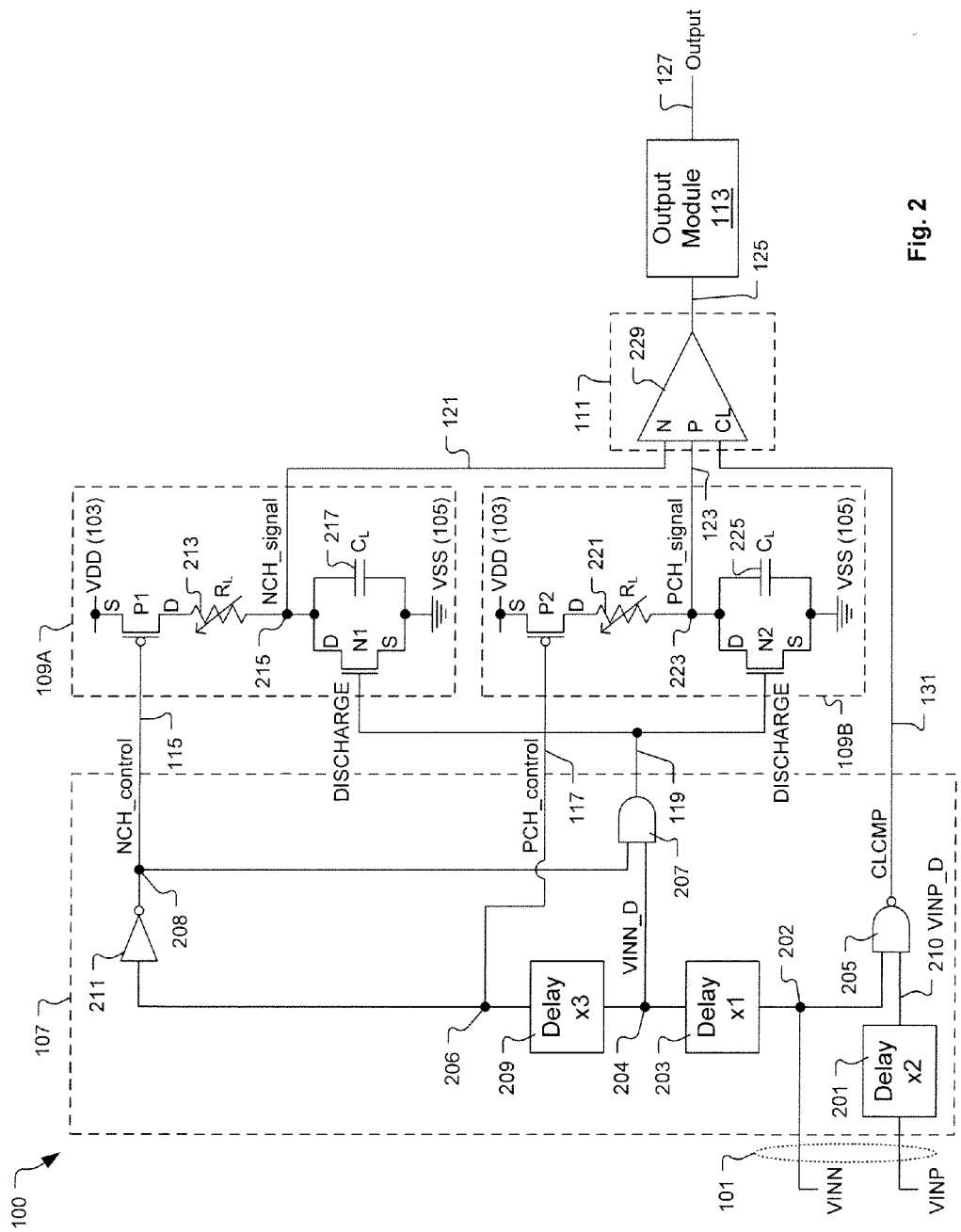
FIG. 2 shows a circuit-level implementation of the system of FIG. 1, in accordance with some embodiments of the present invention.

FIG. 2 shows a circuit-level implementation of the system 100 of FIG. 1, in accordance with some embodiments of the present invention. As previously discussed with regard to FIG. 1, the system 100 of FIG. 2 includes the control module 107, the first charge module 109A, the second charge module 109B, the voltage comparison module 111, and the output module 113. The control module 107 receives the PWM input signal 101 in a non-inverted form as a first input signal VINP. The control module 107 also receives the PWM input signal 101 in an inverted form as a second input signal VINN.

Figure 3:
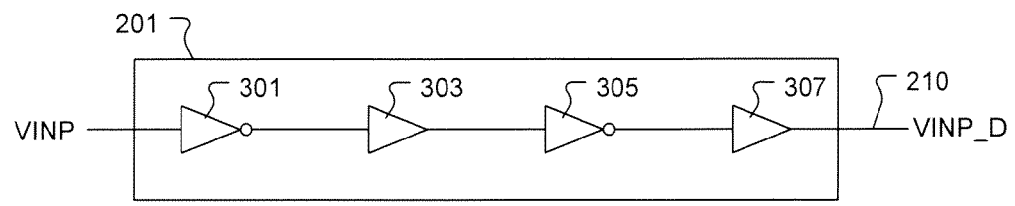
FIG. 3 shows an example of the delay module, in accordance with some embodiments of the present invention.

The non-inverted PWM input signal 101 VINP is transmitted through a delay module 201 to generate a signal VINP_D at a node 210 which is connected to an input of a NAND gate 205. The delay module 201 is configured to generate the signal VINP_D as a delayed version of the non-inverted PWM input signal 101 VINP. FIG. 3 shows an example of the delay module 201, in accordance with some embodiments of the present invention. The example delay module 201 of FIG. 3 includes an inverter 301, a buffer 303, an inverter 305, and a buffer 307 connected in a serial manner to receive the non-inverted PWM input signal 101 VINP as an input and generate the delayed version of the non-inverted PWM input signal 101 VINP as the signal VINP_D on the node 210. It should be understood that the delay module 201 of FIG. 3 is provided by way of example. In other embodiments, the delay module 201 can be configured with any number of inverters and/or buffers, or other circuitry for that matter, so long as the delay module 201 is configured to generate and output the VINP_D signal as an appropriately delayed version of the non-inverted PWM input signal 101 VINP.

The inverted PWM input signal 101 VINN is transmitted to a node 202, which is connected to a second input of the NAND gate 205. The NAND gate 205 outputs the comparison reset control signal 131 CLCMP, which is transmitted to the voltage comparison module 111. Specifically, when both the inverted PWM input signal 101 VINN at the node 202 and the VINP_D signal as output by the delay module 201 on the node 210 (i.e., the non-inverted PWM input signal 101 VINP as delayed relative to the inverted PWM input signal 101 VINN) are in a high state, the comparison reset control signal 131 CLCMP will be in a low state. And, when either of the inverted PWM input signal 101 VINN at the node 202 or the VINP_D signal as output by the delay module 201 on the node 210 are in a low state, the comparison reset control signal 131 CLCMP will be in a high state.

Figure 4:
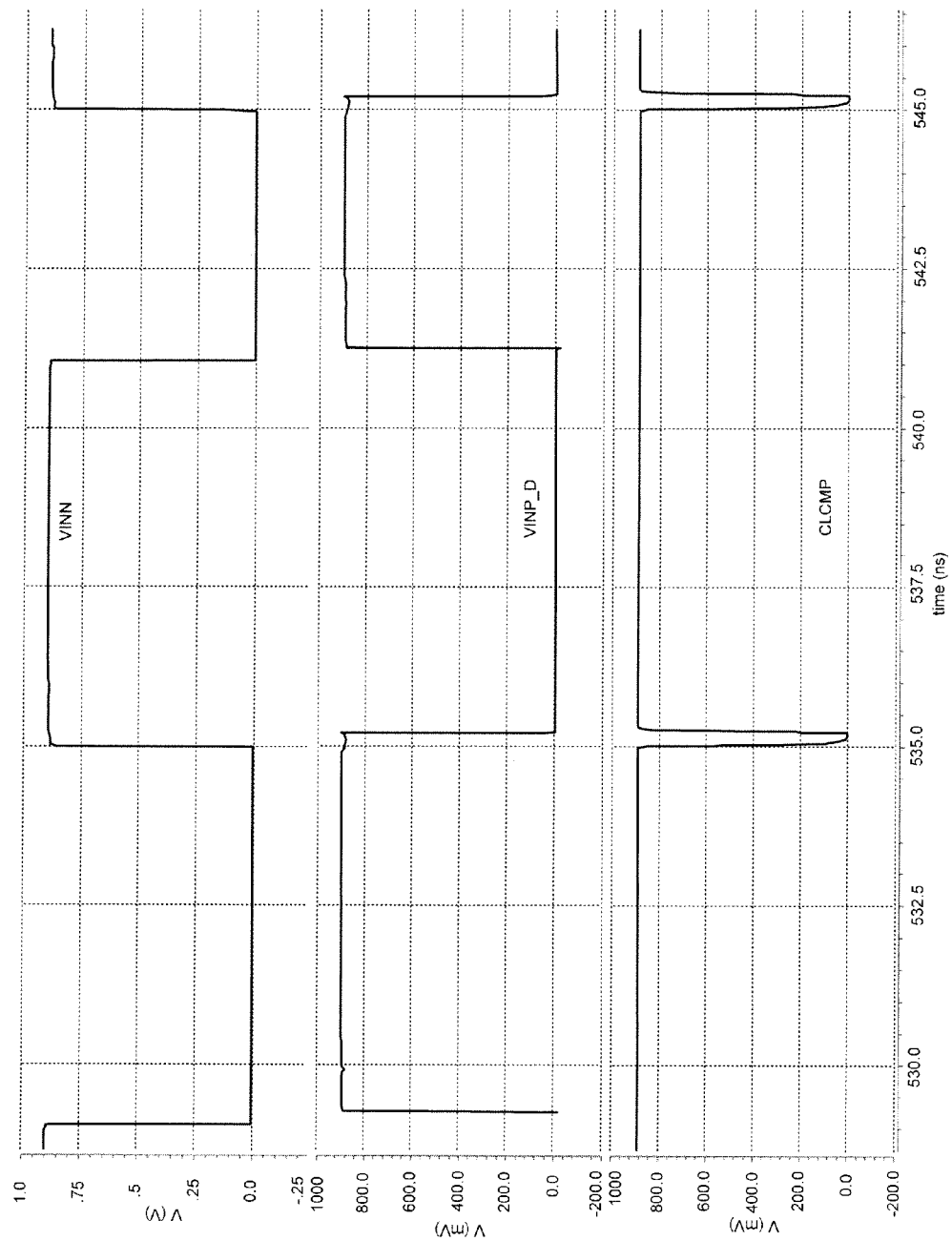
FIG. 4 shows example waveforms of the VINN, VINP_D, and CLCMP signals to demonstrate their relationships to each other as described above, in accordance with some embodiments of the present invention.

FIG. 4 shows example waveforms of the VINN, VINP_D, and CLCMP signals to demonstrate their relationships to each other as described above, in accordance with some embodiments of the present invention. As shown in FIG. 4, due to the inversion and delay between the VINN signal at the node 202 and the VINP_D signal on the node 210, the comparison reset control signal 131 CLCMP will transition to the low state for a period of time substantially equal to the signal delay applied by the delay module 201, at each transition of the VINN signal from the low state to the high state. In other words, the comparison reset control signal 131 CLCMP will transition to the low state when the non-inverted PWM input signal 101 VINP (i.e., the inverted version of VINN) transitions from the high state to the low state. Therefore, the comparison reset control signal 131 CLCMP will transition to the low state for a period of time substantially equal to the signal delay applied by the delay module 201, just after the end of each cycle of the non-inverted PWM input signal 101 VINP, where the edge of each cycle of the non-inverted PWM input signal 101 VINP occurs at its transition from high to low state.

The comparison reset control signal 131 CLCMP is transmitted to a reset input CL of a comparator 229 within the voltage comparison module 111. The comparator 229 is configured to reset itself for the next cycle of the PWM signal when the comparison reset control signal 131 CLCMP is received in the low state at its reset input CL. Therefore, the comparator 229 within the voltage comparison module 111 is reset just after the end of each cycle of the non-inverted PWM input signal 101 VINP, in accordance with the comparison reset control signal 131 CLCMP output from the NAND gate 205 of the control module 107.

Within the control module 107, the inverted PWM input signal 101 VINN at the node 202 is transmitted through a delay module 203 to generate a signal VINN_D at a node 204. The signal VINN_D is a delayed version of the inverted PWM input signal 101 VINN. The signal VINN_D is transmitted through a delay module 209 to generate a signal PCH_control at a node 206. Therefore, the signal PCH_control is a delayed version of the signal VINN_D. The signal PCH_control at the node 206 is output from the control module 107 as the second charge control signal 117. The signal PCH_control is transmitted through an inverter 211 to generate a signal NCH_control at a node 208. Therefore, the signal NCH_control is an inverted version of the signal PCH_control. The signal NCH_control at the node 208 is output from the control module 107 as the first charge control signal 115.

The delay modules 203 and 209 can be configured in a manner similar to that of the example delay module 201 shown in FIG. 3. It should be understood that in various embodiments the delay modules 203 and 209 can be independently configured to include any number of inverters and/or buffers, or other circuitry for that matter, so long as they each output an appropriately delayed version of the signal that they receive as input. In the example embodiment of FIG. 2, the delay module 201 is configured to provide about twice the amount of signal delay as provided by the delay module 203. And, the delay module 209 is configured to provide about three times the amount of signal delay as provided by the delay module 203.

The node 204 is connected to a first input of an AND gate 207, such that the signal VINN_D is provided to the first input of the AND gate 207. The node 208 is connected to a second input of the AND gate 207, such that the signal NCH_control is provided to the second input of the AND gate 207. The AND gate 207 outputs the discharge control signal 119 DISCHARGE, which directs discharging of the capacitors in the first charge module 109A and the second charge module 109B. Specifically, when both the VINN_D signal at the node 204 and the NCH_control at the node 208 are in a high state, the discharge control signal 119 DISCHARGE will be in a high state. And, when either of the VINN_D signal at the node 204 or the NCH_control at the node 208 are in a low state, the discharge control signal 119 DISCHARGE will be in a low state.

Figure 5:
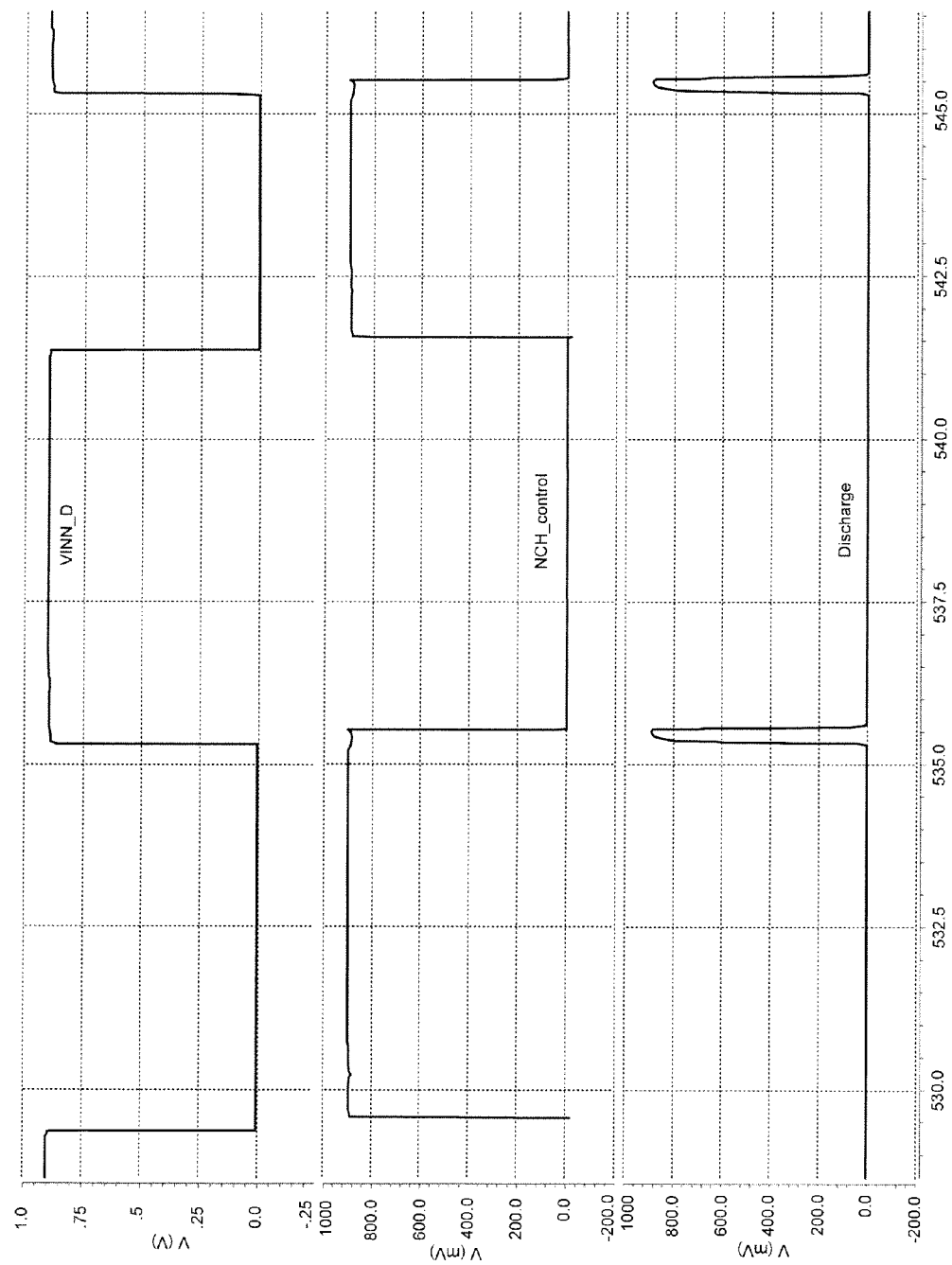
FIG. 5 shows example waveforms of the VINN_D, NCH_control, and DISCHARGE signals to demonstrate their relationships to each other as described above, in accordance with some embodiments of the present invention.

FIG. 5 shows example waveforms of the VINN_D, NCH_control, and DISCHARGE signals to demonstrate their relationships to each other as described above, in accordance with some embodiments of the present invention. As shown in FIG. 5, due to the inversion and delay between the VINN_D signal at the node 204 and the NCH_control signal on the node 208, the discharge control signal 119 DISCHARGE will transition to the high state for a period of time substantially equal to the signal delay applied by the delay module 209, at each transition of the VINN_D signal from the low state to the high state. In other words, the discharge control signal 119 DISCHARGE will transition to the high state for a period of time substantially equal to the signal delay applied by the delay module 209, just after the end of each cycle of the non-inverted PWM input signal 101 VINP.

Both the first charge control signal 115 NCH_control and the discharge control signal 119 DISCHARGE are transmitted to the first charge module 109A. Within the first charge module 109A, the first charge control signal 115 NCH_control is transmitted to control a gate of a first PMOS transistor P1. The first PMOS transistor P1 has a source connected to the power supply VDD 103, and a drain connected to an input terminal of a first resistor 213. The first resistor 213 has an output terminal connected to a node 215. A first capacitor 217 is connected between the node 215 and the reference ground potential VSS 105. Also, within the first charge module 109A, the discharge control signal 119 DISCHARGE is transmitted to control a gate of a first NMOS transistor N1. The first NMOS transistor N1 has a drain connected to the node 215, and a source connected to the reference ground potential VSS 105.

In some embodiments, the first resistor 213 is configured as a variable resistor. In some embodiments, the first resistor 213 is configured as a fixed resistor. In various embodiments, the first resistor 213 can be defined as either a single resistor or as an array of resistors, with the array of resistors including a number of resistors connected in series and/or in parallel. Also, in some embodiments, the first resistor 213 can be defined in a programmable manner, such that its electrical resistance can be changed during operation of the system 100 by adding or removing resistance. For example, switches can be utilized to provide for adding or removing resistance to/from the first resistor 213. In various embodiments, the first capacitor 217 can be defined as either a single capacitor or as an array of capacitors connected between the node 215 and the reference ground potential VSS 105. And, in some embodiments, the first capacitor 217 can be defined in a programmable manner, such that its electrical capacitance can be changed during operation of the system 100 by adding or removing capacitance. For example, switches can be utilized to provide for adding or removing capacitance to/from the first capacitor 217. Adjustment of the resistance of the first resistor 213 and/or capacitance of the first capacitor 217 can be done to speed up or slow down charging of the first capacitor 217 to allow for handling of frequency variations within the PWM signal. For example, when handling a PWM input signal having a frequency range of about 10 megaHertz (MHz) to about 30 MHz, the resistance of the first resistor 213 may be set at about 10 times the resistance used to handle a PWM input signal having a frequency range of about 100 MHz to about 300 MHz.

Figure 6:
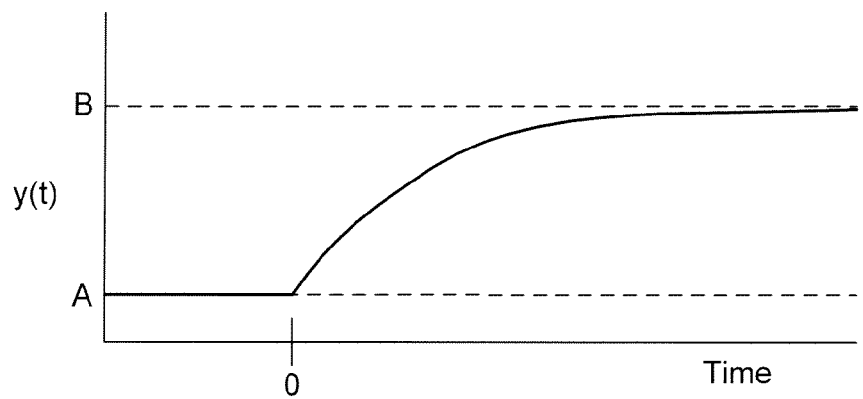
FIG. 6 shows a plot of the RC circuit charge response of Equation 1.

Based on the configuration of the first charge module 109A, it should be understood that the first PMOS transistor will turn on when the NCH_control signal is in the low state, which correlates to the time in which the non-inverted PWM input signal 101 VINP is in the low state. When the first PMOS transistor is on, voltage will accumulate on the first capacitor 217 in accordance with the RC circuit charge response as shown in Equation 1. FIG. 6 shows a plot of the RC circuit charge response of Equation 1.

$$y(t)=B-(B-A)e^{-t/\tau}, \text{ where } \tau=R_L C_L \qquad \text{Equation 1:}$$

Therefore, the voltage accumulation on the first capacitor 217 will asymptotically approach a maximum voltage value as a function of the charge duration, with the amount of accumulated voltage being a function of the product of the resistance $R_L$ of the first resistor 213 and the capacitance $C_L$ of the first capacitor 217. The voltage on the first capacitor 217 is present on the node 215. Therefore, the voltage present on the first capacitor 217 is provided as the first node voltage 121 (NCH_signal) to the voltage comparison module 111, and more specifically to an input N of the comparator 229 within the voltage comparison module 111.

Both the second charge control signal 117 PCH_control and the discharge control signal 119 DISCHARGE are transmitted to the second charge module 109B. Within the second charge module 109B, the second charge control signal 117 PCH_control is transmitted to control a gate of a second PMOS transistor P2. The second PMOS transistor P2 has a source connected to the power supply VDD 103, and a drain connected to an input terminal of a second resistor 221. The second resistor 221 has an output terminal connected to a node 223. A second capacitor 225 is connected between the node 223 and the reference ground potential VSS 105. Also, within the second charge module 109B, the discharge control signal 119 DISCHARGE is transmitted to control a gate of a second NMOS transistor N2. The second NMOS transistor N2 has a drain connected to the node 223, and a source connected to the reference ground potential VSS 105.

In some embodiments, the second resistor 221 is configured as a variable resistor. In some embodiments, the second resistor 221 is configured as a fixed resistor. In various embodiments, the second resistor 221 can be defined as either a single resistor or as an array of resistors, with the array of resistors including a number of resistors connected in series and/or in parallel, so long as the resistance of the second resistor 221 is substantially equal to the resistance of the first resistor 213. Also, in some embodiments, the second resistor 221 can be defined in a programmable manner, such that its electrical resistance can be changed during operation of the system 100 by adding or removing resistance. For example, switches can be utilized to provide for adding or removing resistance to/from the second resistor 221. In various embodiments, the second capacitor 225 can be defined as either a single capacitor or as an array of capacitors connected between the node 223 and the reference ground potential VSS 105, so long as the capacitance of the second capacitor 225 is substantially equal to the capacitance of the first capacitor 217. And, in some embodiments, the second capacitor 225 can be defined in a programmable manner, such that its electrical capacitance can be changed during operation of the system 100 by adding or removing capacitance. For example, switches can be utilized to provide for adding or removing capacitance to/from the second capacitor 225. Adjustment of the resistance of the second resistor 221 and/or capacitance of the second capacitor 225 can be done to speed up or slow down charging of the second capacitor 225 to allow for handling of frequency variations within the PWM signal. For example, when handling a PWM input signal having a frequency range of about 10 MHz to about 30 MHz, the resistance of the second resistor 221 may be set at about 10 times the resistance used to handle a PWM input signal having a frequency range of about 100 MHz to about 300 MHz.

Based on the configuration of the second charge module 109B, it should be understood that the second PMOS transistor will turn on when the second charge control signal 117 PCH_control signal is in the low state, which correlates to the time in which the non-inverted PWM input signal 101 VINP is in the high state. When the first PMOS transistor is on, voltage will accumulate on the second capacitor 221 in accordance with the RC circuit charge response as shown in Equation 1 and FIG. 6.

Therefore, the voltage accumulation on the second capacitor 225 will asymptotically approach a maximum voltage value as a function of the charge duration, with the amount of accumulated voltage being a function of the product of the resistance $R_L$ of the second resistor 221 and the capacitance $C_L$ of the second capacitor 225. It should be appreciated that the resistance $R_L$ of the second resistor 221 is substantially equal to the resistance $R_L$ of the first resistor 213. Also, it should be appreciated that the capacitance $C_L$ of the second capacitor 225 is substantially equal to the capacitance $C_L$ of the first capacitor 217. The voltage on the second capacitor 225 is present on the node 223. Therefore, the voltage present on the second capacitor 225 is provided as the second node voltage 123 (PCH_signal) to the voltage comparison module 111, and more specifically to an input P of the comparator 229 within the voltage comparison module 111.

The comparator 229 of the voltage comparison module 111 is connected and configured to compare the voltage present on the node 215 (received as the first node voltage 121 NCH_signal) and the node 223 (received as the second node voltage 123 PCH_signal). The comparator 229 is configured to generate an output signal 125 representing a first logical state when the voltage on the node 215 is less than the voltage on the node 223, i.e., when the NCH_signal 121 is less than the PCH_signal. At the end of a given cycle of the non-inverted PWM input signal 101 VINP, the voltage present on the node 215 will be less than the voltage present on the node 223 if the non-inverted PWM input signal 101 VINP is in the high state longer than in the low state during the given cycle of the non-inverted PWM input signal 101 VINP. In other words, if the duty cycle of the non-inverted PWM input signal 101 VINP is greater than 50% during the given cycle of the non-inverted PWM input signal 101 VINP, the voltage present on the node 215 will be less than the voltage present on the node 223 at the end of the given cycle of the non-inverted PWM input signal 101 VINP. Therefore, a given cycle of the non-inverted PWM input signal 101 VINP having a duty cycle greater than 50% will decode to the first logical state of the output signal 125 as generated by the comparator 229.

Similarly, the comparator 229 is configured to generate the output signal 125 representing a second logical state (opposite that of the first logical state) when the voltage on the node 215 is greater than the voltage on the node 223, i.e., when the NCH_signal 121 is greater than the PCH_signal. At the end of a given cycle of the non-inverted PWM input signal 101 VINP, the voltage present on the node 215 will be greater than the voltage present on the node 223 if the non-inverted PWM input signal 101 VINP is in the low state longer than in the high state during the given cycle of the non-inverted PWM input signal 101 VINP. In other words, if the duty cycle of the non-inverted PWM input signal 101 VINP is less than 50% during the given cycle of the non-inverted PWM input signal 101 VINP, the voltage present on the node 215 will be greater than the voltage present on the node 223 at the end of the given cycle of the non-inverted PWM input signal 101 VINP. Therefore, a given cycle of the non-inverted PWM input signal 101 VINP having a duty cycle less than 50% will decode to the second logical state of the output signal 125 as generated by the comparator 229.

The RC charging profile of the first capacitor 217 and the second capacitor 225, as shown in FIG. 6, provides voltage inputs to the comparator 229 that are relatively close to each other, regardless of the differences in charging time between the first capacitor 217 and the second capacitor 225. It should be appreciated that use of a linear current source to charge the first capacitor 217 and the second capacitor 225, in lieu of their respective RC circuits, will not be able to provide the closeness in voltages as stored on the first capacitor 217 and the second capacitor 225 when there are substantial differences in charging time between the first capacitor 217 and the second capacitors 225. Therefore, use of the RC circuits to charge the first capacitor 217 and the second capacitor 225 allows for fast and accurate operation of the comparator 229 in the presence of substantially different charging times of the first capacitor 217 and the second capacitor 225, which may occur as a result of changing frequencies of the PWM input signal. Therefore, the system 100 is able to accurately decode PWM input signals that include significant variations in frequency. For example, with its RC charging configurations, the system 100 can handle decoding of a PWM input signal that varies in frequency over a range of 10 MHz to 300 MHz, or more, or less.

Figure 7:
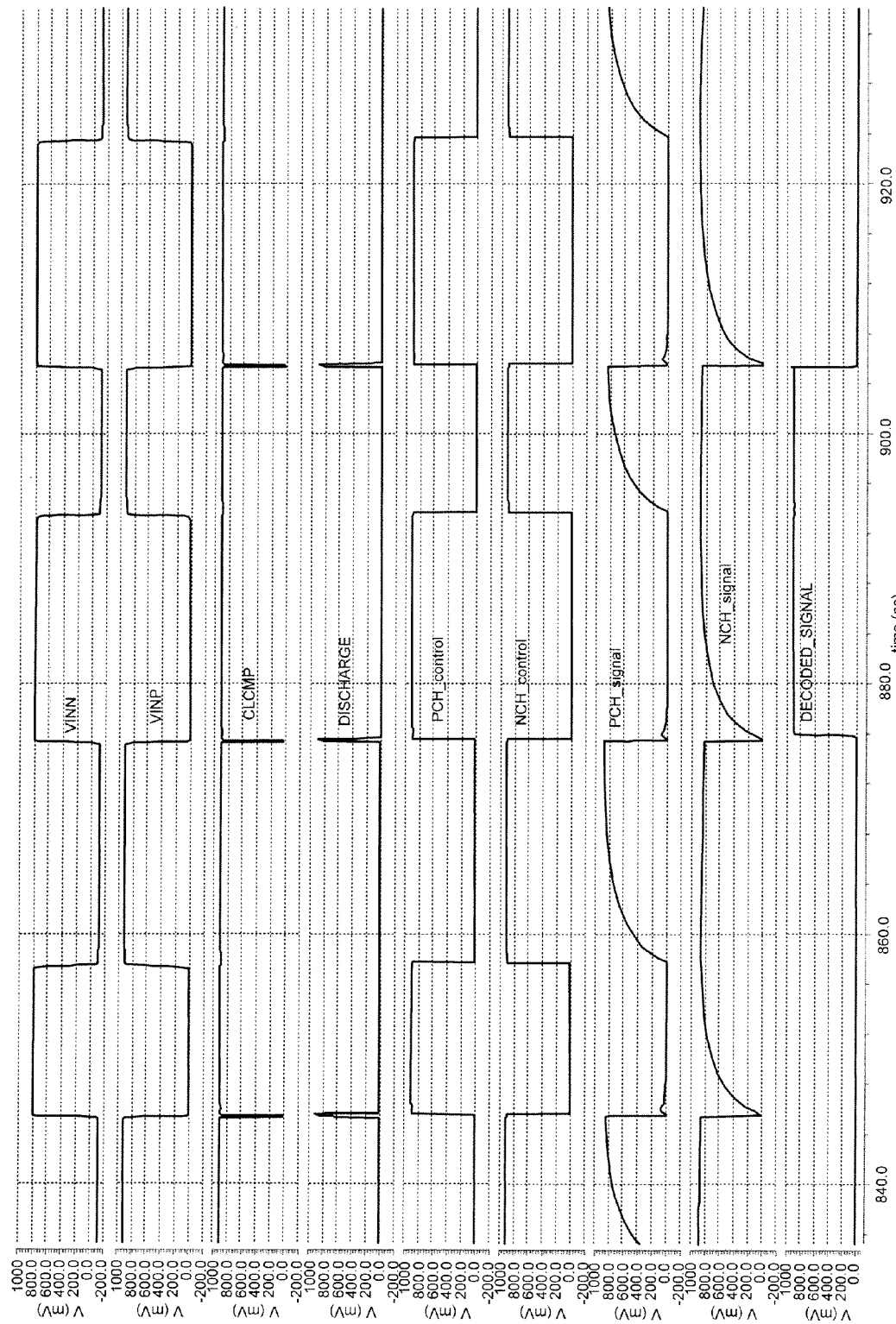
FIG. 7 shows example waveforms of the operation of the control module, the first charge module, the second charge module, and the voltage comparison module, in accordance with embodiments of the present invention as previously described with regard to FIG. 2.

It should be understood that the signals 125 output by the comparator 229 are a decoding of the non-inverted PWM input signal 101 VINP. FIG. 7 shows example waveforms of the operation of the control module 107, the first charge module 109A, the second charge module 109B, and the voltage comparison module 111, in accordance with embodiments of the present invention as previously described with regard to FIG. 2. In some embodiments, the DECODED_SIGNAL waveform as shown in FIG. 7 corresponds to the output 125 of the comparator 229 of the voltage comparison module 111. In some embodiments, the DECODED_SIGNAL waveform as shown in FIG. 7 corresponds to the output 127 of the output module 113, which is a processed version of the output 125 of the comparator 229 of the voltage comparison module 111.

As shown in FIG. 7, the cycle edge of the PWM input signal 101 occurs when the non-inverted PWM input signal 101 VINP transitions from the high state to the low state. Therefore, FIG. 7 shows two complete cycles of the PWM input signal 101. At the beginning of each cycle of the PWM input signal 101, the comparison reset control signal 131 CLCMP rapidly drops to a low state to cause the comparator 229 to reset itself for the cycle of the PWM input signal 101, then the comparison reset control signal 131 CLCMP rapidly transitions back to the high state to allow the comparator 229 to perform the comparison between the first node voltage 121 (NCH_signal) and the second node voltage 123 (PCH_signal) for the cycle of the PWM input signal 101.

Also, at the beginning of each cycle of the PWM input signal 101, the discharge control signal 119 DISCHARGE spikes to a high state to turn on both the first NMOS transistor N1 and the second NMOS transistor N2, which in turn causes discharging of the first capacitor 217 and the second capacitor 225, respectively. Then, in correspondence with the low state of the PWM input signal 101, the first charge control signal 115 NCH_control transitions to a low state to turn on charging of the first capacitor 217 of the first charge module 109A, as indicated by the NCH_control signal 121. Also, in correspondence with the low state of the PWM input signal 101, the second charge control signal 117 PCH_control transitions to a high state to turn off charging of the second capacitor 225 of the second charge module 109B.

Then, in correspondence with the high state of the PWM input signal 101, the first charge control signal 115 NCH_control transitions to a high state to turn off charging of the first capacitor 217 of the first charge module 109A, as indicated by the NCH_control signal 121. Also, in correspondence with the high state of the PWM input signal 101, the second charge control signal 117 PCH_control transitions to a low state to turn on charging of the second capacitor 225 of the second charge module 109B. In this manner, during a given cycle of the PWM input signal 101 VINP, the first capacitor 217 of the first charge module 109A charges when the PWM input signal 101 VINP is in the low state, such that the voltage accumulated on the first capacitor 217 represents a duration of the PWM input signal 101 VINP in the low state during the given cycle. Similarly, during a given cycle of the PWM input signal 101 VINP, the second capacitor 225 of the second charge module 109B charges when the PWM input signal 101 VINP is in the high state, such that the voltage accumulated on the second capacitor 225 represents a duration of the PWM input signal 101 VINP in the high state during the given cycle.

In following, comparison of the voltages on each of the first capacitor 217 and the second capacitor 225 during a given cycle of the PWM input signal 101 VINP provides a measure of the duty cycle parameter of the given cycle of the PWM input signal 101. Specifically, if the voltage on the second capacitor 225 exceeds the voltage on the first capacitor 217 during a given cycle of the PWM input signal 101, the duty cycle parameter of the given cycle of the PWM input signal 101 is determined to be greater than 50%. And, conversely, if the voltage on the first capacitor 217 exceeds the voltage on the second capacitor 225 during a given cycle of the PWM input signal 101, the duty cycle parameter of the given cycle of the PWM input signal 101 is determined to be less than 50%. The duty cycle parameter as determined for a given cycle of the PWM input signal 101 is used to decode the given cycle of the PWM input signal 101. In the example of FIG. 7, the cycle of the PWM input signal 101 having the duty cycle greater than 50% decodes to a high logical state in the output signal DECODED_SIGNAL. And, in the example of FIG. 7, the cycle of the PWM input signal 101 having the duty cycle less than 50% decodes to a low logical state in the output signal DECODED_SIGNAL. In this manner, the system 100 operates to decode the PWM input signal 101 based on its cycle-by-cycle duty cycle, where a duty cycle greater that 50% decodes to a high logical state, and a duty cycle less than 50% decodes to a low logical state.

Figure 8:
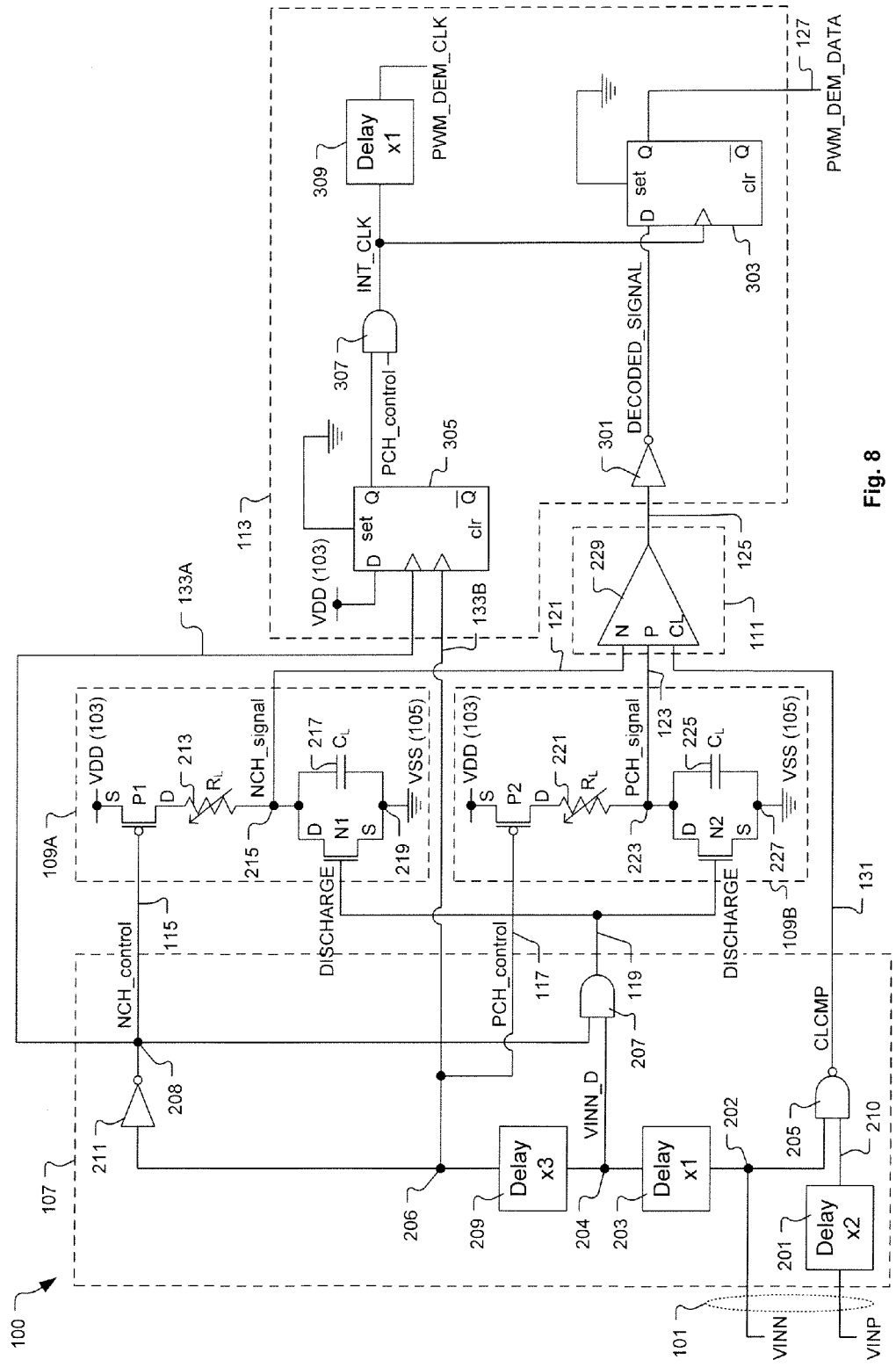
FIG. 8 shows the system of FIGS. 1 and 2 with a circuit-level implementation of the output module, in accordance with some embodiments of the present invention.

FIG. 8 shows the system 100 of FIGS. 1 and 2 with a circuit-level implementation of the output module 113, in accordance with some embodiments of the present invention. The output module 113 includes an inverter 301 having an input connected to receive the output 125 of the comparator 229 of the voltage comparison module 111. The inverter 301 has an output connected to a data input terminal (D) of a latch 303. In some embodiments, the latch 303 is defined as a flip-flop circuit. The latch 303 includes a clock input terminal (>) connected to receive a clock signal. The latch 303 is configured to store a signal corresponding to the digital logic state received at the data input terminal (D), and output the stored signal through a data output terminal (Q), in accordance with the clock signal received at the clock input terminal (>). The output of the latch 303 is provided as the decoded output signal 127 of the system 100, labeled as PWM_DEM_DATA in FIG. 8.

The output module 113 as shown in FIG. 8 also includes internal clocking circuitry configured to generate the clock signal provided to the clock input terminal (>) of the latch 303. The internal clocking circuitry includes a latch 305 configured to have two clock input terminals (>), with a first of the clock input terminals (>) connected to receive the first charge control signal 115 NCH_control as indicated by connection 133A, and with a second of the clock input terminals (>) connected to receive the second charge control signal 117 PCH_control as indicated by connection 133B. The latch 305 has a data input terminal (D) connected to the power supply VDD 103. The latch 305 has a data output terminal (Q) connected to a first input of an AND gate 307. In this configuration, whenever either the first charge control signal 115 NCH_control transitions high or the second charge control signal 117 PCH_control transitions high, a high state signal is transmitted from the data output terminal (Q) to the first input of the AND gate 307. The AND gate 307 also has a second input connected to receive the second charge control signal 117 PCH_control. The AND gate 307 has an output which provides the clock signal INT_CLK that is connected to the clock input terminal (>) of the latch 303.

Therefore, when the second charge control signal 117 PCH_control is in a high state in conjunction with the latch 305 outputting the high state signal, the clock signal INT_CLK output of the AND gate 307 will be a high state signal. And, when either the second charge control signal 117 PCH_control is in a low state or the latch 305 is not outputting a signal, the clock signal INT_CLK output of the AND gate 307 will be a low state signal. In this manner, the clock signal INT_CLK is a delayed and inverted version of the non-inverted PWM input signal 101 VINP. The output module 113 can also be configured to provide the clock signal INT_CLK as a clock output signal PWM_DEM_CLK. In this particular embodiment of FIG. 8, the clock signal INT_CLK is transmitted through a delay module 309 to generate the clock output signal PWM_DEM_CLK. It should be appreciated that the clock signal INT_CLK is generated within the output module 113 based on the PWM input signal 101, and there is no external clock signal required for operation of the output module 113, or for operation of the system 100 as a whole.

Figure 9:
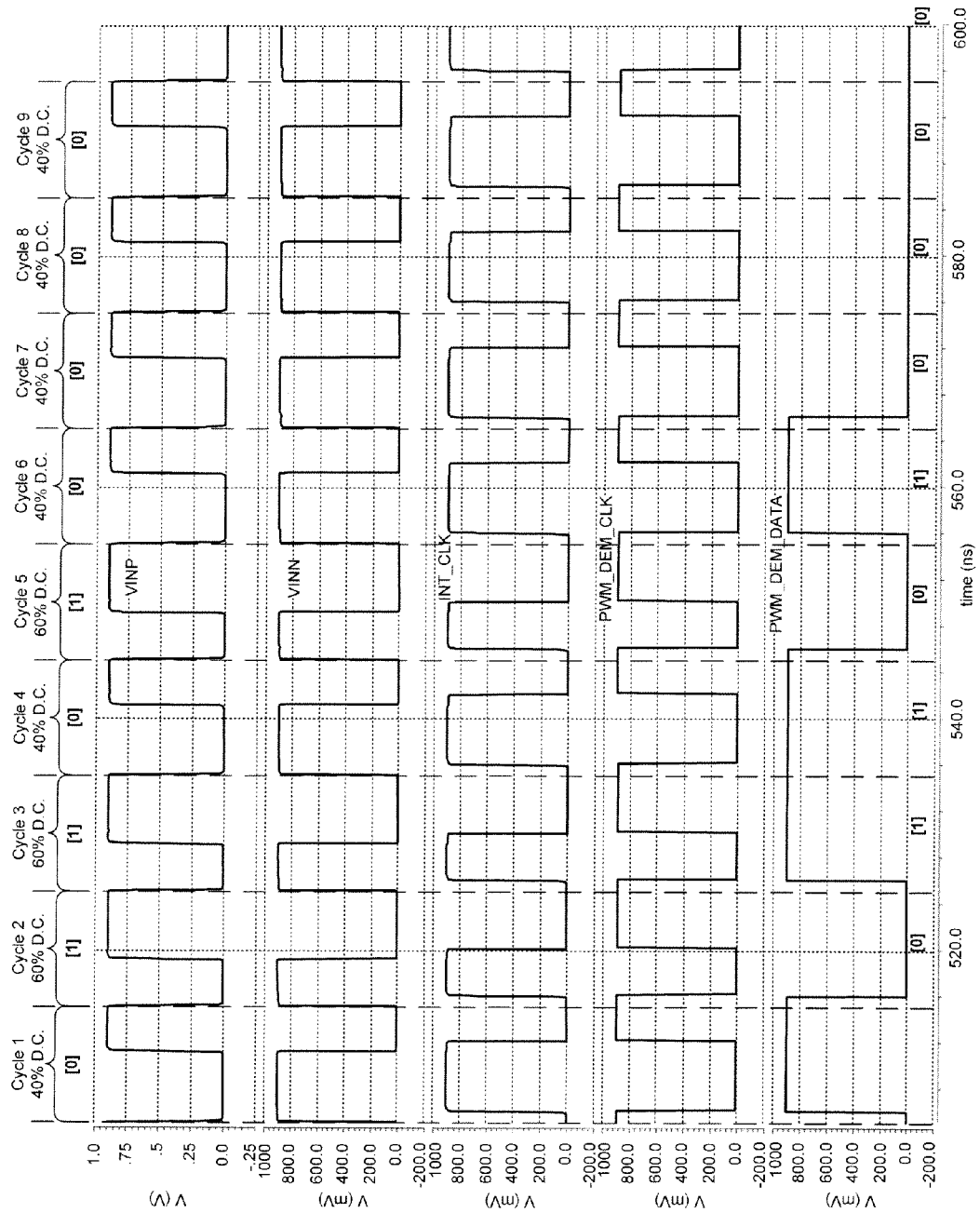
FIG. 9 shows example waveforms of the operation of the output module of FIG. 8, in accordance with embodiments of the present invention as previously described with regard to FIG. 2.

FIG. 9 shows example waveforms of the operation of the output module 113 of FIG. 8, in accordance with embodiments of the present invention as previously described with regard to FIG. 2. The PWM input signal 101 is shown in both its non-inverted form VINP and in its inverted form VINN. The clock signal INT_CLK output by the AND gate 307 is also shown, as well as the clock output signal PWM_DEM_CLK, which is an inverted version of the clock signal INT_CLK in this particular embodiment. And, the output of the latch 303 is shown as the PWM_DEM_DATA signal.

FIG. 9 shows nine cycles of the PWM input signal 101, labeled as Cycle 1 through Cycle 9. The duty cycle parameter of each cycle of the PWM input signal 101 is also labeled in FIG. 9 as either 40% D.C. (duty cycle) or 60% D.C. The 40% D.C. cycles of the PWM input signal 101 decode to a low logical state, as indicated by the label [0]. The 60% D.C. cycles of the PWM input signal 101 decode to a high logical state, as indicated by the label [1]. As shown in FIG. 9, the output signal PWM_DEM_DATA is generated in accordance with each low state-to-high state transition of the clock signal INT_CLK. Therefore, at the end of Cycle 1 of the PWM input signal 101, the output signal PWM_DEM_DATA transitions to the low state indicating a decoding of Cycle 1 of the PWM input signal 101 as a low logical state. Then, at the end of Cycle 2 of the PWM input signal 101, the output signal PWM_DEM_DATA transitions to the high state indicating a decoding of Cycle 2 of the PWM input signal 101 as a high logical state. Then, at the end of Cycle 3 of the PWM input signal 101, the output signal PWM_DEM_DATA remains in the high state indicating a decoding of Cycle 3 of the PWM input signal 101 as a high logical state, and so on.

It should be understood that the 40% D.C. and 60% D.C. parameters used for decoding of the PWM input signal 101 in the example of FIG. 9 are provided by way of example. In other embodiments, different D.C. parameters can be set to determine whether a given cycle of the PWM input signal 101 should decode to a high logical state or a low logical state. For example, in some embodiments, a 45% D.C. cycle of the PWM input signal 101 can decode to the low logical state, with a 55% D.C. cycle of the PWM input signal 101 decoding to the high logical state. Or, in some embodiments, a 10% D.C. cycle of the PWM input signal 101 can decode to the low logical state, with a 90% D.C. cycle of the PWM input signal 101 decoding to the high logical state. In some embodiments, a D.C. range for decoding of a given cycle of the PWM input signal 101 to the low logical state can extend from about 10% to about 45%. And, in some embodiments, a D.C. range for decoding of a given cycle of the PWM input signal 101 to the high logical state can extend from about 55% to about 90%. The particular D.C. parameters used to determine whether a given cycle of the PWM input signal 101 should decode to the high logical state or the low logical state can be set based on a sensitivity/accuracy of the voltage comparison module 111.

Figure 10:
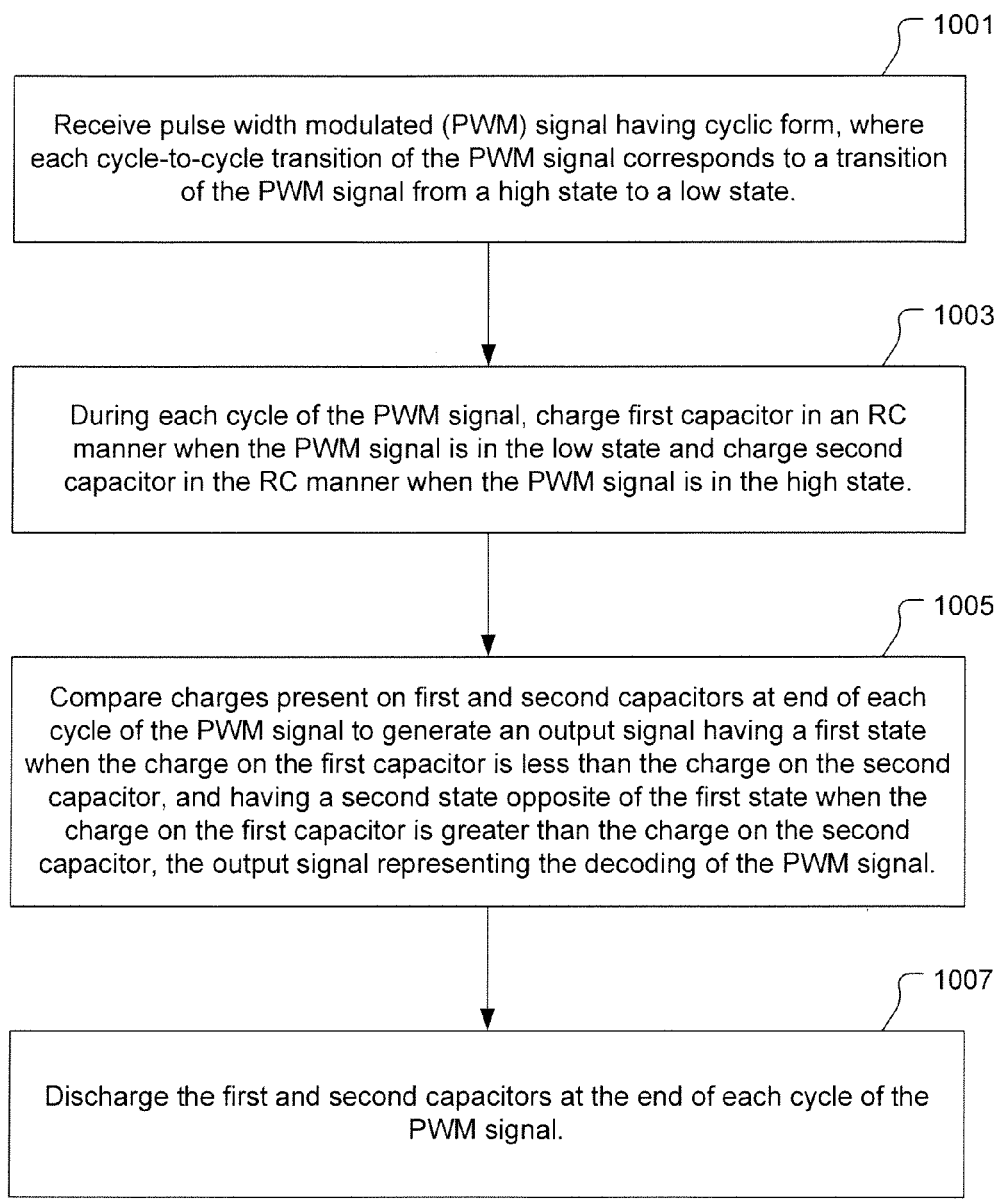
FIG. 10 shows a method for decoding a pulse width modulated signal, in accordance with some embodiments of the present invention.

FIG. 10 shows a method for decoding a pulse width modulated signal, in accordance with some embodiments of the present invention. The method includes an operation 1001 for receiving a PWM signal having a cyclic form, where each cycle-to-cycle transition of the PWM signal corresponds to a transition of the PWM signal from a high state to a low state. The method also includes an operation 1003 for charging, during each cycle of the PWM signal, a first capacitor in an RC manner when the PWM signal is in the low state, and charging a second capacitor, during each cycle of the PWM signal, in the RC manner when the PWM signal is in the high state.

The first capacitor is connected within a first RC circuit including a first resistor connected between a power supply and the first capacitor. The first resistor is switchably connected to the power supply, such as illustrated by the first resistor 213 being switchably connected to the power supply VDD 103 by the first PMOS transistor P1 in the first charge module 109A of FIG. 2. Also, the second capacitor is connected within a second RC circuit including a second resistor connected between the power supply and the second capacitor. The second resistor is switchably connected to the power supply, such as illustrated by the second resistor 221 being switchably connected to the power supply VDD 103 by the second PMOS transistor P2 in the second charge module 109B of FIG. 2. Also, the first and second resistors have a substantially equal electrical resistance, and the first and second capacitors have a substantially equal electrical capacitance. In this manner, voltage will accumulate on each of the first and second capacitors in a substantially equal manner when its respective RC circuit is connected to the power supply.

The method also includes an operation 1005 for comparing the voltages present on the first and second capacitors at an end of each cycle of the PWM signal to generate an output signal, such that the output signal has a first state when the voltage on the first capacitor is less than the voltage on the second capacitor, and such that the output signal has a second state opposite of the first state when the voltage on the first capacitor is greater than the voltage on the second capacitor, wherein the output signal represents the decoding of the PWM signal. The method also includes an operation 1007 for discharging the first and second capacitors at the end of each cycle of the PWM signal.

In the method of FIG. 10, a duration of the high state of the PWM signal during a given cycle of the PWM signal determines a decoding of the given cycle of the PWM signal to either a high logical state or a low logical state. In other words, the method of FIG. 10 operates to decode the PWM signal based on its cycle-by-cycle duty cycle parameter. In some embodiments, a given cycle of the PWM signal decodes to a high logical state in the output signal when a duration of the high state of the PWM signal in the given cycle of the PWM signal is greater than half of a total duration of the given cycle of the PWM signal, and the given cycle of the PWM signal decodes to a low logical state in the output signal when the duration of the high state of the PWM signal in the given cycle of the PWM signal is less than half of the total duration of the given cycle of the PWM signal. In these embodiments, a given cycle of the PWM signal having a duty cycle greater that 50% decodes to a high logical state, and a given cycle of the PWM signal having a duty cycle less than 50% decodes to a low logical state.

In other embodiments, a given cycle of the PWM signal decodes to a low logical state in the output signal when a duration of the high state of the PWM signal in the given cycle of the PWM signal is greater than half of a total duration of the given cycle of the PWM signal, and the given cycle of the PWM signal decodes to a high logical state in the output signal when the duration of the high state of the PWM signal in the given cycle of the PWM signal is less than half of the total duration of the given cycle of the PWM signal. In these embodiments, a given cycle of the PWM signal having a duty cycle greater that 50% decodes to a low logical state, and a given cycle of the PWM signal having a duty cycle less than 50% decodes to a high logical state.

In some embodiments, the method of FIG. 10 can also include operations for generating a clock signal based on the PWM signal, and transmitting the output signal in accordance with the clock signal. Such an embodiment is demonstrated by operation of the output module 113 as shown in FIG. 8, in which the clock signal INT_CLK is generated based on the first charge control signal 115 NCH_control and the second charge control signal 117 PCH_control, which are each derived from the PWM input signal 101. Also, operation of the output module 113 of FIG. 8 demonstrates the transmitting of the output signal PWM_DEM_DATA in accordance with the clock signal INT_CLK.

The system 100, as described herein, includes analog circuits for comparing signals and is based on charging and discharging capacitors and comparing voltages accumulated across the capacitors. In some embodiments, the capacitor voltage comparisons are performed by an operational amplifier, i.e., comparator, in open loop. Use of RC charging of the capacitors, rather than charging with constant current sources, is utilized to allow for operation of the system 100 over a wide range of PWM input signal frequencies. Use of RC charging of the capacitors, which asymptotically approaches an equivalent maximum voltage on each capacitor, provides for accurate decoding of the PWM input signal over a wide range of cycle durations that may be present in the PWM input signal, because the difference between voltages present at the inputs to the comparator will be maintained within a small enough range to allow for accurate operation of the comparator. It should be appreciated that the system 100, as described herein, does not require an external clock signal and is of low power consumption. Also, it should be appreciated that because the system 100 operates to decode the PWM input signal based upon signals derived from the PWM input signal, the system 100 does not require a reference signal generated separate from the PWM input signal. Also, the system 100 is tunable for a wide range of PWM input signal frequencies. And, the system 100 allows for simple implementation within a compact area on a semiconductor chip.

It should be understood that the systems, circuits, and methods disclosed herein for decoding a PWM signal can be used with many different types of semiconductor memory devices. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure. In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate). As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device. One of skill in the art will recognize that the present invention is not limited to the two dimensional and three dimensional exemplary structures mentioned herein, but can be implemented with all relevant memory structures or other types of computing structures within the spirit and scope of the invention as described herein and as understood by one of skill in the art.

Any of the operations described herein that form part of the invention are useful machine operations. The invention also relates to a device or an apparatus for performing these operations. The device and/or apparatus may be specially constructed for the required purpose, such as a special purpose computer chip or computer. When defined as a special purpose computer chip or computer, the computer chip or computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the systems and circuits for decoding PWM signals as described herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A system for decoding a pulse width modulated signal, comprising:
   a first charge module including a first RC circuit including a first resistor and a first capacitor;
   a second charge module including a second RC circuit including a second resistor and a second capacitor, the second resistor substantially equal to the first resistor, the second capacitor substantially equal to the first capacitor;
   a voltage comparison module including a comparator connected to compare voltages present on the first and second capacitors, and output a signal having a first state when the voltage on the first capacitor is less than the voltage on the second capacitor, and output a signal having a second state opposite of the first state when the voltage on the first capacitor is greater than the voltage on the second capacitor; and
   a control module configured to receive a pulse width modulated (PWM) signal as an input signal, the control module configured to generate control signals based on the received PWM signal,
   the control signals including a first charge control signal directing charging of the first capacitor in accordance with a low state of the PWM signal,
   the control signals including a second charge control signal directing charging of the second capacitor in accordance with a high state of the PWM signal,
   the control signals including a discharge control signal directing discharge of both the first capacitor and the second capacitor at each cycle-to-cycle transition of the PWM signal, the cycle-to-cycle transition of the PWM signal corresponding to a transition of the PWM signal from a high state to a low state.

2. A system for decoding a pulse width modulated signal as recited in claim 1, wherein the first charge control signal is a non-inverted and delayed version of the PWM signal.

3. A system for decoding a pulse width modulated signal as recited in claim 2, wherein the second charge control signal is an inverted and delayed version of the PWM signal.

4. A system for decoding a pulse width modulated signal as recited in claim 1, wherein the control module is configured to generate the discharge control signal such that the discharge control signal spikes from a low state to a high state at the cycle-to-cycle transition of the PWM signal so as to turn on NMOS transistors which cause the discharging of both the first capacitor and the second capacitor.

5. A system for decoding a pulse width modulated signal as recited in claim 1, wherein the control module is configured to generate a comparison reset control signal directing reset of the comparator at each cycle-to-cycle transition of the PWM signal.

6. A system for decoding a pulse width modulated signal as recited in claim 1, further comprising:
an output module configured to process the signals output by the voltage comparison module and provide a decoded output signal representing a decoding of the PWM signal.

7. A system for decoding a pulse width modulated signal as recited in claim 6, wherein the output module is configured to generated an internal clock signal based on the PWM signal, and wherein the output module is configured to output the decoded output signal in accordance with the internal clock signal.

8. A circuit for decoding a pulse width modulated signal, comprising:
a first PMOS transistor having a gate, a source, and a drain, the gate of the first PMOS transistor connected to receive a first charge control signal as a delayed and non-inverted version of a pulse width modulated (PWM) signal, the source of first PMOS transistor connected to a power supply;
a first resistor connected between the drain of the first PMOS transistor and a first charge node;
a first capacitor connected between the first charge node and a reference ground potential;
a first NMOS transistor having a gate, a source, and a drain, the drain of the first NMOS transistor connected to the first charge node, the source of the first NMOS transistor connected to the reference ground potential, the gate of the first NMOS transistor connected to receive a discharge control signal;
a second PMOS transistor having a gate, a source, and a drain, the gate of the second PMOS transistor connected to receive a second charge control signal as a delayed and inverted version of the PWM signal, the source of second PMOS transistor connected to the power supply;
a second resistor connected between the drain of the second PMOS transistor and a second charge node;
a second capacitor connected between the second charge node and the reference ground potential;
a second NMOS transistor having a gate, a source, and a drain, the drain of the second NMOS transistor connected to the second charge node, the source of the second NMOS transistor connected to the reference ground potential, the gate of the second NMOS transistor connected to receive the discharge control signal; and
a comparator connected to compare voltages present on the first and second charge nodes, the comparator configured to generate a signal having a first state when the voltage on the first charge node is less than the voltage on the second charge node, the comparator configured to generate a signal having a second state opposite of the first state when the voltage on the first charge node is greater than the voltage on the second charge node, wherein the signals output by the comparator are a decoding of the PWM signal.

9. A circuit for decoding a pulse width modulated signal as recited in claim 8, wherein the discharge control signal is generated to spike to a high state with rapid return to a low state at each cycle-to-cycle transition of the PWM signal, wherein the cycle-to-cycle transition of the PWM signal corresponds to a transition of the PWM signal from a high state to a low state.

10. A circuit for decoding a pulse width modulated signal as recited in claim 9, wherein the comparator is configured to receive a comparison reset control signal directing reset of the comparator at each cycle-to-cycle transition of the PWM signal.

11. A circuit for decoding a pulse width modulated signal as recited in claim 10, further comprising:
a control module configured to receive the PWM signal as an input signal and generate each of the first charge control signal, the second charge control signal, the discharge control signal, and the comparison reset control signal based upon the PWM signal.

12. A circuit for decoding a pulse width modulated signal as recited in claim 8, wherein an electrical resistance of the first resistor is substantially equal to an electrical resistance of the second resistor, and wherein an electrical capacitance of the first capacitor is substantially equal to an electrical capacitance of the second capacitor.

13. A circuit for decoding a pulse width modulated signal as recited in claim 8, further comprising:
an output module configured to receive the signal generated by the comparator, the output module including a latch connected to hold a version of the signal received from the comparator, the latch connected to output the signal held in the latch in accordance with a clock signal received at a clock terminal of the latch.

14. A circuit for decoding a pulse width modulated signal as recited in claim 13, wherein the output module includes clock derivation circuitry configured to derive an internal clock signal from the PWM signal, the clock derivation circuitry connected to transmit the internal clock signal to the clock terminal of the latch, such that the latch is connected to output the signal held in the latch in accordance with the internal clock signal derived from the PWM signal.

15. A method for decoding a pulse width modulated signal, comprising:
receiving a pulse width modulated (PWM) signal having a cyclic form, wherein each cycle-to-cycle transition of the PWM signal corresponds to a transition of the PWM signal from a high state to a low state;
during each cycle of the PWM signal, charging a first capacitor in an RC manner when the PWM signal is in the low state and charging a second capacitor in the RC manner when the PWM signal is in the high state;
comparing voltages present on the first and second capacitors at an end of each cycle of the PWM signal to generate an output signal having a first state when the voltage on the first capacitor is less than the voltage on the second capacitor, and having a second state opposite of the first state when the voltage on the first capacitor is greater than the voltage on the second capacitor, the output signal representing the decoding of the PWM signal.

16. A method for decoding a pulse width modulated signal as recited in claim 15, wherein a duration of the high state of the PWM signal during a given cycle of the PWM signal determines a decoding of the given cycle of the PWM signal to either a high logical state or a low logical state.

17. A method for decoding a pulse width modulated signal as recited in claim 15, wherein a given cycle of the PWM signal decodes to a high logical state in the output signal when a duration of the high state of the PWM signal in the given cycle of the PWM signal is greater than half of a total duration of the given cycle of the PWM signal, and
wherein the given cycle of the PWM signal decodes to a low logical state in the output signal when the duration of the high state of the PWM signal in the given cycle of the PWM signal is less than half of the total duration of the given cycle of the PWM signal.

18. A method for decoding a pulse width modulated signal as recited in claim 15, further comprising:
  discharging the first and second capacitors at the end of each cycle of the PWM signal.

19. A method for decoding a pulse width modulated signal as recited in claim 15, wherein the first capacitor is connected within a first RC circuit including a first resistor connected between a power supply and the first capacitor, the first resistor switchably connected to the power supply, and
  wherein the second capacitor is connected within a second RC circuit including a second resistor connected between the power supply and the second capacitor, the second resistor switchably connected to the power supply,
  wherein the first and second resistors have a substantially equal electrical resistance, and wherein the first and second capacitors have a substantially equal electrical capacitance.

20. A method for decoding a pulse width modulated signal as recited in claim 15, further comprising:
  generating a clock signal based on the PWM signal; and
  transmitting the output signal in accordance with the clock signal.

* * * * *